US006181140B1

(12) United States Patent
Vokey et al.

(10) Patent No.: US 6,181,140 B1
(45) Date of Patent: Jan. 30, 2001

(54) METHOD OF ESTIMATING THE LOCATION OF A CABLE BREAK INCLUDING A MEANS TO MEASURE RESISTIVE FAULT LEVELS FOR CABLE SECTIONS

(75) Inventors: David E. Vokey, Bellingham, WA (US); Myron Loewen, Niverville (CA)

(73) Assignee: Norscan Inc., Conover, NC (US)

( * ) Notice: Under 35 U.S.C. 154(b), the term of this patent shall be extended for 0 days.

(21) Appl. No.: 09/092,849

(22) Filed: Jun. 8, 1998

(51) Int. Cl.[7] ................................................ G01R 31/08
(52) U.S. Cl. ............................................ 324/523; 324/528
(58) Field of Search .................................... 324/519, 522, 324/523, 527, 528, 539, 543, 71.1, 509, 510, 511, 532; 379/26

(56) References Cited

U.S. PATENT DOCUMENTS

| | | | |
|---|---|---|---|
| 4,095,174 | 6/1978 | Ishido | 324/557 |
| 4,317,151 | 2/1982 | de Mesmacker et al. | 361/69 |
| 4,947,469 | * | 8/1990 | Vokey et al. | 324/523 |
| 5,990,689 | * | 11/1999 | Vokey et al. | 324/523 |

FOREIGN PATENT DOCUMENTS

| | | |
|---|---|---|
| 0793112a1 | 9/1997 | (EP) . |
| WO 98/08104 | 2/1998 | (WO) . |

\* cited by examiner

*Primary Examiner*—Safet Metjahic
*Assistant Examiner*—Vincent Q. Nguyen
(74) *Attorney, Agent, or Firm*—Murray E. Thrift; Adrian D. Battison; Michael R. Williams

(57) ABSTRACT

A method and apparatus are used for locating cable breaks and resistive faults in cables, including fibre optic cables. The conductive shield or armour of the cable is divided into sections, usually at a splice. A step function voltage is applied to one end of the conductive shield. Remote sensors at the end of each section monitor the voltage and current as a function of time and at steady state. The measured data are encoded as current pulses and transmitted along the armour to the end of the cable. A computer at the cable end calculates from the measured voltages and currents the capacitance of each section of the shield. A broken section is identified by comparing the calculated and original capacitances of the sections and the distance along the broken section to the break is calculated from the calculated and original capacitances of the broken section. Resistive faults in the cable are located by calculating a fault resistance of each section of the shield from the measured steady state voltages and currents. A section containing a resistive fault is identified from the magnitude of the calculated fault resistance and the distance to the resistive fault is calculated from the measured steady state voltages and currents of the faulted section.

22 Claims, 4 Drawing Sheets

METHOD OF ESTIMATING THE LOCATION OF A CABLE BREAK INCLUDING A MEANS TO MEASURE RESISTIVE FAULT LEVELS FOR CABLE SECTIONS

FIELD OF THE INVENTION

The present invention relates to the location of cable breaks and resistive faults in fiber optic cable.

BACKGROUND

In the past two decades the mass deployment of fiber optic cable has been instrumental in increasing the reliability of the world wide telecommunication network. This mass deployment has also resulted in the concentration of communication circuits into long lengths of physically small and mechanically vulnerable cables.

Fiber optic cables placed in the outside environment fall into one of three general categories, aerial, buried and underground. Aerial installation usually offers the lowest cost for new cable placement particularly when the pole route exists with support capacity available. Direct buried is favored on long haul routes when ploughing and trenching can be carried out in favorable right of way conditions. In new suburban areas buried cable construction is often a requirement to eliminate pole structures which compromise aesthetic appeal. Underground construction is generally defined as cable placement in pre-built duct structures buried under city streets. Due to the high initial construction costs of the duct structures, underground is the most expensive placement method but necessary to avoid tearing up city streets for the repair or addition of cable.

Each installation method has reliability and maintenance issues. The threat to the cable structures comes from two sources, man made problems and environmental conditions. Excluding craft error, man made failures include dig ups, collision, fire, and gunshot damage. Environmental threats include, rodents, lightning, floods, ice and power line failure.

Major outages are usually the result of a complete cut through of the cable structure. Unintentional cable dig ups are responsible for 50 percent or more of outages. Due to the high capacity of a fiber optic cable, a single cut cable can result in thousands of dollars a minute in lost revenue. It is therefore of critical importance that the location of the cable cut is determined quickly and a repair crew dispatched to the scene to restore the cable.

A well known method of locating a fiber cable break employs an Optical Time Domain Reflectometer (OTDR). In this method short pulses of light are launched into the severed fiber. A portion of the pulse is reflected back at the break and the time difference from the moment of launch to the return of the reflected light pulse is measured to estimate the distance to the break. For maximum benefit, an OTDR must be constantly measuring a test fiber in every cable selected for monitoring. The main drawback of this method is that OTDR instruments are costly and a fiber must be made available for the measurement. Deploying OTDR systems to actively monitor a large network of cables is therefore is costly and frequently involves complex interfacing to active optical fibers. The present invention provides an effective means to detect and locate a break in a fiber optic cable which does not employ OTDR techniques and does not require access to a test optical fiber.

SUMMARY

According to one aspect of the present invention there is provided a method of locating a cable break in a cable having a conductive shield extending therealong, wherein the conductive shield is divided into a plurality of sections sequentially along the cable, with each section having an original capacitance, said method comprising:

applying a step function voltage to one end of the conductive shield;

measuring voltage and current as a function of time at each end of each section of the shield;

calculating from the measured voltages and currents a calculated capacitance of each section of the shield;

identifying a broken section containing the break by comparing the calculated and original capacitances of the sections;

calculating the distance along the broken section to the break from the calculated and original capacitances of the broken section.

In preferred embodiments, the method further comprises locating a resistive fault in the cable by the steps of:

measuring steady state voltage and current at each end of each sect ion o f the shield;

calculating from the measured steady state voltages and currents a calculated fault resistance of each section of the shield;

identifying a faulted section containing a resistive fault from the magnitude of the calculated fault resistance; and calculating the distance along the broken section to the resistive fault from the measured steady state voltages and currents of the faulted section.

Thus, as an additional benefit, damage to the outer insulating cable jacket may be detected on a section by section basis, providing an indication of damage to the protective outer layers of the cable structure.

According to another aspect of the invention there is provided an apparatus for locating a cable break in a cable having a conductive shield extending therealong, wherein the conductive shield is divided into a plurality of sections sequentially along the cable, with each section having an original capacitance, said method comprising:

a power supply for applying a step function voltage to one end of the conductive shield;

sensors for measuring voltage and current as a function of time at each end of each section of the shield; and a computer including:

means for calculating from the measured voltages and currents a calculated capacitance of each section of the shield;

means for identifying a broken section containing the break by comparing the calculated and original capacitances; and means for calculating the distance along the broken section to the break from the calculated and original capacitances of the broken section.

In preferred embodiments the apparatus, further comprises means for locating a resistive fault in the cable, wherein:

the sensors include means for measuring steady state voltage and current at each end of each section of the shield;

the computer includes:

means for calculating from the measured steady state voltages and currents a calculated fault resistance of each section of the shield;

means for identifying a faulted section containing a resistive fault from the magnitude of the calculated fault resistance; and means for calculating the distance along the faulted section to the resistive fault from the measured steady state voltages and currents of the faulted section.

BRIEF DESCRIPTION OF THE DRAWINGS

In the accompanying drawings, which illustrate the theoretical basis and an exemplary embodiment of the present invention.

DETAILED DESCRIPTION
General Description

The applicants' method makes use of the metallic armour or shield of a fiber optic cable to estimate the location of a cut or break in a fiber optic cable. The metallic armour and surrounding insulating plastic jacket form a coaxial circuit when referenced to earth ground.

Figure 1:
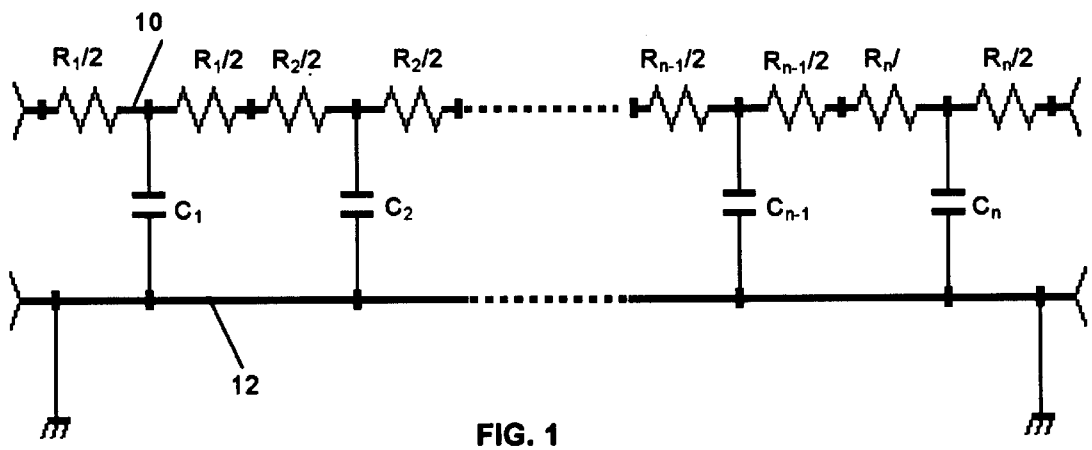
FIG. 1 is a low frequency cable shield equivalent circuit.

FIG. 1 shows a low frequency model which can be used to electrically represent the coaxial circuit formed by the cable armour or shield 10 and the plastic insulating jacket with an earth return 12. The cable circuit is divided into n discrete sections which represent the individual cable lengths spliced together. Each section has a series resistance $R_x$ and a shunt capacitance $C_x$, with the subscript x designating the section 1 to n.

Figure 2:
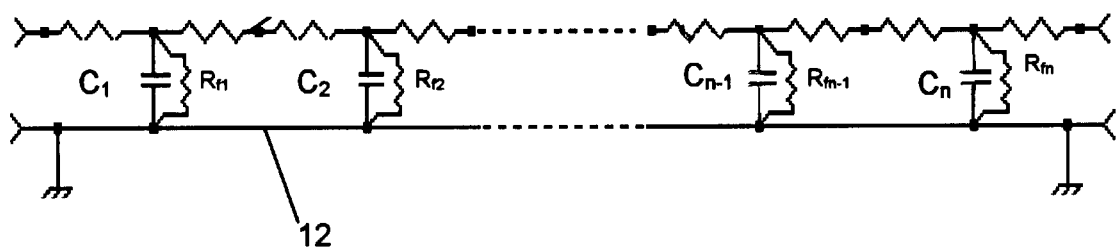
FIG. 2 is a low frequency cable shield equivalent circuit with resistive faults.

Damage to the insulating jacket could result in faults to ground parallel to the shunt capacitances. Section fault to ground resistances $R_{fx}$ are added to the electrical equivalent model as shown in FIG. 2.

Figure 3:
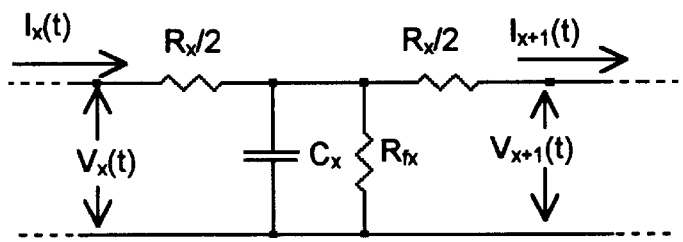
FIG. 3 illustrates the voltages and currents in one cable section.

The method for determining the distance to a cable break including resistive faults for every cable section requires that the fault to ground resistance $R_{fx}$ and shunt capacitance $C_x$ be determined for every section. In simple terms, the method involves the application of a step function voltage to the circuit at the beginning of the cable under test and the measurement of the voltage and current as a function of time at the beginning and end of every section as illustrated in FIG. 3. The resistive and capacitive parameters $R_{fx}$ and $C_x$ are then calculated from the steady state and transient responses respectively.

Detailed Mathematical Description

To determine the individual shunt capacitance $C_x$ and fault resistance $R_{fx}$ to ground for every section, a step input DC voltage is applied and the input and output current and voltage response measured for every cable section. The measured parameters are used to calculate the transient and steady state response of every section. The general response of the network at any point along the line is given by:

$$v(t)=V_0+(V_f-V_0)(1-e^{(-t/rc)}). \tag{1}$$

Where: $V_0$ is the initial line voltage
$V_f$ is the final line voltage
$rc$ is the circuit time constant
and $$i(t)=I_0+(I_f-I_0)(1-e^{(-t/rc)}) \tag{2}$$

Where: $I_0$ is the initial line current
$I_f$ is the final line current

Figure 4:
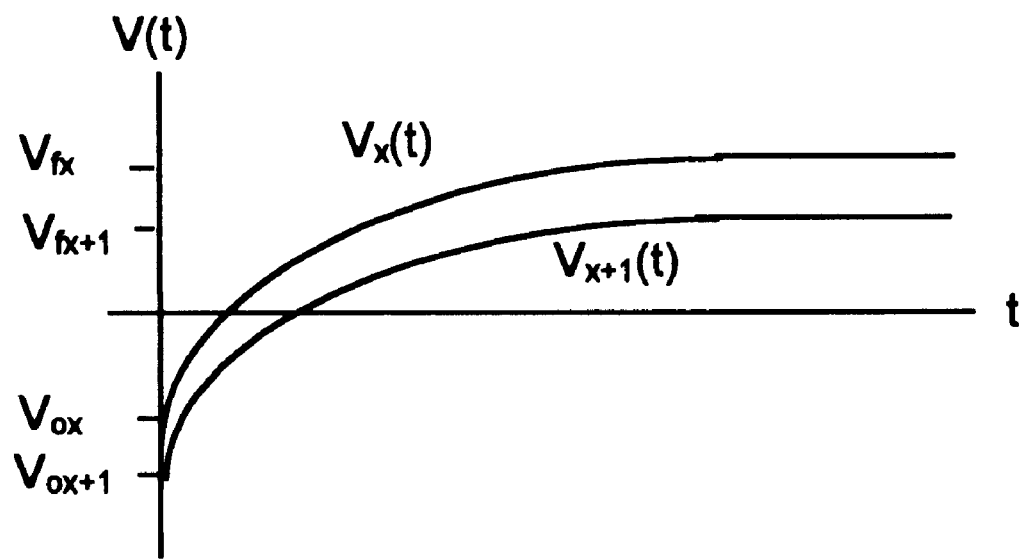
FIG. 4 is a chart of the line voltages at the beginning and end of a cable section as a function of time.
Figure 5:
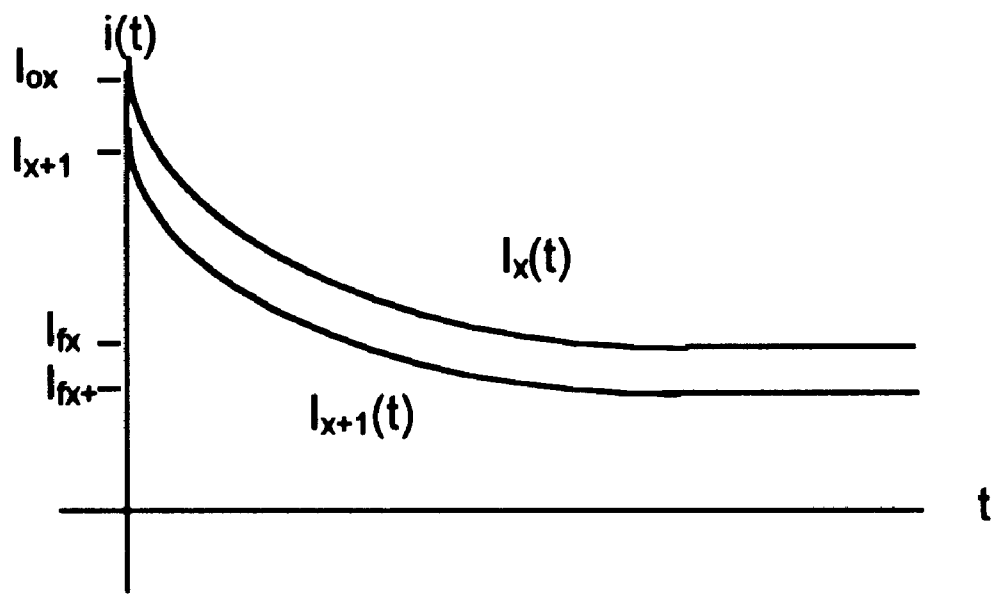
FIG. 5 is a chart of the line currents at the beginning and end of a cable section as a function of time.

FIG. 4 shows the general voltage response and FIG. 5 shows the general current response of the nth section to a step voltage input. From the steady state conditions reached when the capacitive component of the line is charged, the nth section fault resistance is estimated by:

$$R_{fx}=V_s/I_s \tag{3}$$

where $$V_s=(V_{fx}+V_{fx+1})/2 \tag{4}$$

$$I_s=I_{fx}-I_{fx+1} \tag{5}$$

and $V_{fx}$ is the steady state voltage at the beginning of the xth cable section $V_{fx+1}$ is the steady state voltage at the end of the xth cable section $I_{fx}$ is the steady state current at the beginning of the xth cable section $I_{fx+1}$ is the steady state current at the end of the nth cable section The total capacitive charge for the xth cable section is calculated from the transient and steady state line currents as follows:

$$Q_x = \int_0^T i_x(t)dt - I_{fx}T - \int_0^T i_{x+1}(t) + I_{fx+1}T \tag{6}$$

where $Q_x$ is the electrical charge of the xth cable section
$i_x(t)$ is the current into the xth cable section The capacitance for the xth cable section is calculated from the charge as follows:

$$C_x=Q_x/V \tag{7}$$

where $C_x$ is the capacitance of the xth section in farads
V is the average voltage across the cable section
and $$V=(V_n-V_{n+1})/2 \tag{8}$$

Equations (6) and (8) can be numerically evaluated by measuring the in put and output voltages and currents as functions of time for each cable section.

The fault resistance and capacitance for every cable section are thereby determined. In the event of a cable cut only $i_x(t)$, $V_x(t)$, are reported from the last section. In this case all of the steady state current is fault current and all of the charge current is into the remaining cable section.

Figure 6:
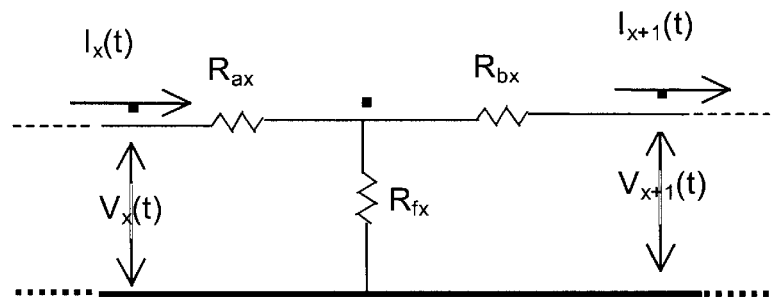
FIG. 6 is an equivalent circuit for locating a resistive fault to ground.

As the capacitance per unit length is assumed to be constant the distance to the cut is estimated:

$$D=L(C_f/C_x) \tag{9}$$

where L is the original section length
$C_f$ is the calculated capacitance after the cut $C_x$ is the original capacitance of the section before the cut If the series resistance for a section is known, then referring to FIG. 6, the series resistance along the cable shield or armour to the location of a resistive fault to ground can be estimated from the steady state conditions by:

$$\text{Ran}=(V_x-V_{x+1}-I_{x+1}\text{RI})/(I_x-I_{x+1}) \quad (10)$$

where: RI is the total series resistance of the cable section (Ran+Rbn)

The distance to the fault from the beginning of the section is calculated by:

$$D=Dt\ \text{Ran}/\text{RI} \quad (11)$$

where: D is the distance to the fault

Dt is the total length of the cable section

In summary, by mathematically analyzing both the transient and steady state response of a cable section to a step input function, the distance to any cable open and the distance to a resistive fault can be determined accurately.

Circuit Description

Figure 7:
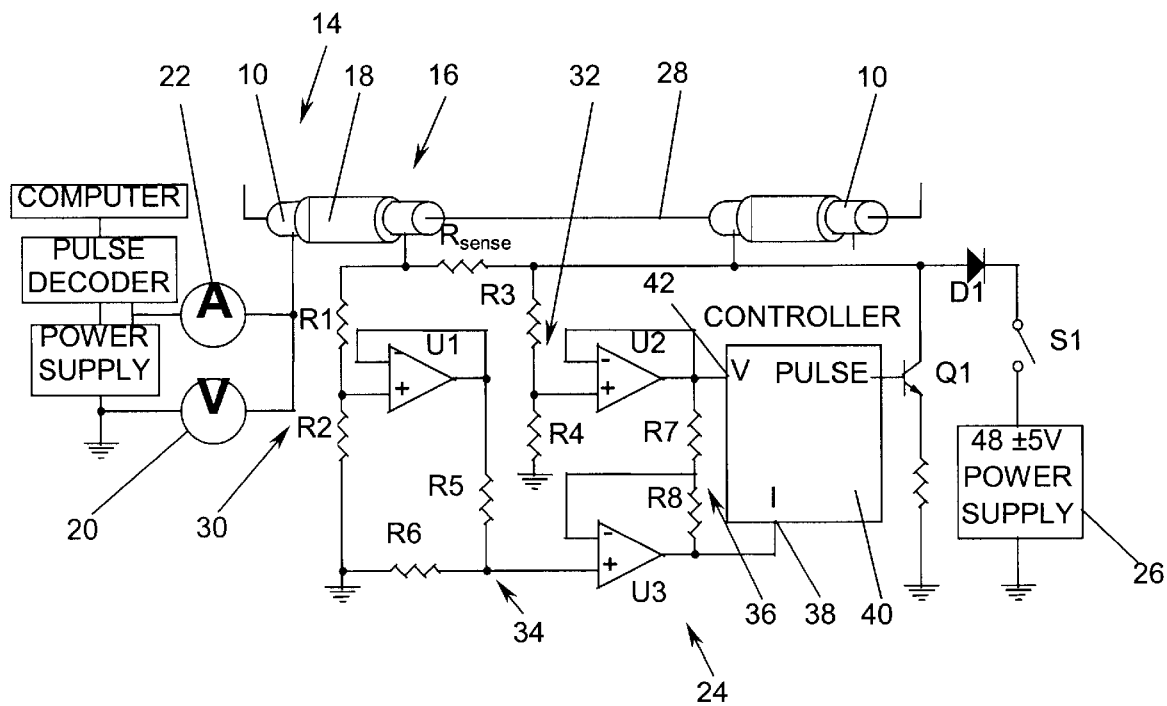
FIG. 7 is a block diagram of one embodiment of the apparatus.

The basic circuit for the measurement system including a remote sensor is shown in FIG. 7. A computer controlled measurement system 14 is connected to the metal armor or shield 10 of the cable 16 under test. The armor is insulated from ground by an insulating plastic jacket 18. The measurement system has a digital voltmeter 20 and ammeter 22 to collect transmitted data from remote sensors 24 (one shown) which are often located at distances of 100 km or more away from the start of the cable. The data generated by the remote sensors is sent over the cable sheath as a series of current pulses. Encoded in the data are the charge and voltage readings from each remote location. A power supply 26 in the measurement system generates ±48 volts which is applied to the line to power the remote sensors and initiate the test sequence. Once the data is collected from all of the remote sensors, the computer calculates the line parameters using equations (7), (9), (10), and (11).

The most convenient method of dividing the cable into measurement sections is to place remote sensing and measurement devices 24 at the cable splice locations. For fiber optic cables the typical cable section lengths range from 5 to 10 km. At the splice points the optical fibers 28 from one section are joined to the corresponding optical fiber in the next cable section. The entire spice arrangement is enclosed in a mechanical case which typically has sufficient space to allow placement of a small electronic device inside the case.

The circuit in FIG. 7 details the measurement system and one remote measurement device between cable sections 1 and 2. Resistor $R_{sense}$ is in series with the cable armour 10 of the two sections and electrically completes the circuit through the splice. $R_{sense}$ is a shunt resistor of a few ohms and converts the current passing from one section to the next into a proportional voltage. Two voltage dividers 30, consisting of resistors R1 and R2, and 32, consisting of resistors R3 and R4, are connected to opposite sides of resistor $R_{sense}$. The positive summing inputs of operational amplifiers U1 and U2 are connected across $R_{sense}$ by the voltage dividers 30 and 32 and step down the line voltage and buffer the downstream analogue to digital (A/D) converters from the line. The output of U1 is applied through a voltage divider 34 consisting of resistors R5 and R6 to the positive input of an amplifier U3. The output of U2 is applied through a divider 36 consisting of resistors R7 and R8 to the negative input of U3. U3 forms a differential amplifier which scales the voltage drop across the current sense resistor $R_{sense}$. The output of U3 is applied to a current measurement input 38 of the A/D converter of a controller 40. The output of U2, which is proportional to the line to ground voltage, is applied to a voltage measurement input 42 of the A/D converter of the controller. The readings collected are processed by the controller and the data is transmitted over the cable sheath to the measurement system via current pulse modulation of a transistor Q1.

Figure 8:
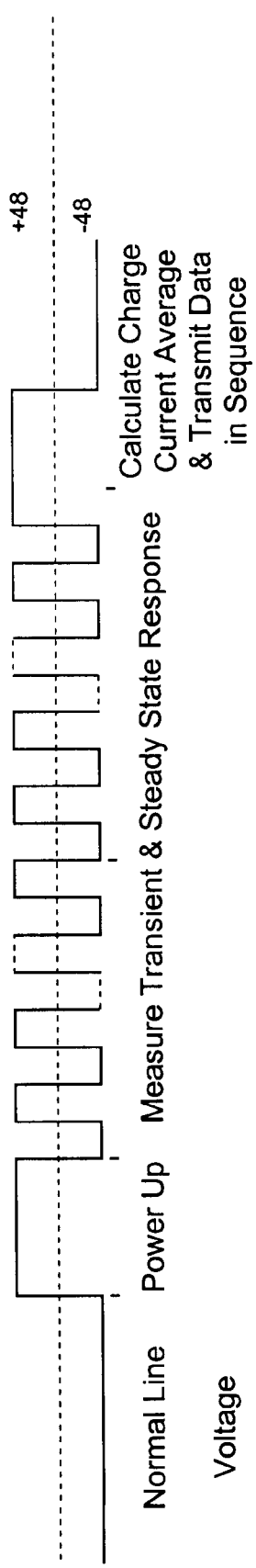
FIG. 8 shows the voltage sequence applied to the cable to measure segment characteristics.

The timing diagram in FIG. 8 shows the sequence of line voltages to complete the line charge current and the steady state current and voltage readings. The line voltage between tests is −48V and when it switches to +48V all the sensors power up. The measurement system begins the test by toggling the line voltage. This charges and discharges the armour through all the sensors. The sensors approximately synchronize on the first pulse after the command and begin logging readings for several charge and discharge cycles. When the test is over the sensors send back the results specified by the power up command. Data is encoded by the controller as current pulses which are detected by the measurement system.

To ensure that data sent by the remote sensors is not corrupted, only one sensor at a time may transmit. This is accomplished by assigning each remote sensor a unique code that represents a specific time slot during report phase of a test. The sensors are numbered so that the farthest from the start of the cable reports first. This order increases the speed of detecting opens. The capacitance of the open segment can be converted to a distance and reported first.

While one embodiment of the present invention is described in the foregoing, it is to be understood that other embodiments are possible within the scope of the invention, which is to be ascertained solely by the scope of the appended claims.

What is claimed is:

1. A method of locating a cable break in a cable having a conductive shield extending therealong, wherein the conductive shield is divided into a plurality of sections sequentially along the cable, with each section having an original capacitance, said method comprising:

applying a step function voltage to one end of the conductive shield;

measuring voltage and current as a function of time at each end of each section of the shield;

calculating from the measured voltages and currents a calculated capacitance of each section of the shield;

identifying a broken section containing the break by comparing the calculated and original capacitances of the sections;

calculating the distance along the broken section to the break from the calculated and original capacitances of the broken section.

2. A method according to claim 1 comprising:

providing a base station at said one end of the cable;

providing a plurality of remote sensor stations at junctions of respective pairs of the cable sections;

actuating each remote sensor station to perform the step of measuring voltage and current in response to the application of the step function voltage to the shield.

3. A method according to claim 2 comprising transmitting data representing the measured voltages and currents from the remote sensor stations to the base station and performing the steps of calculating the calculated capacitance of each section of the shield and the distance along the broken section to the break at the base station.

4. A method according to claim 3 comprising transmitting the data as electrical pulses on the cable shield.

5. A method according to claim 3 comprising transmitting the data from the respective remote sensor stations at different times.

6. A method according to claim 5 comprising transmitting the data from the remote sensor stations in sequence along the cable, starting with the remote sensor station farthest from the base station.

7. A method according to claim 1 further comprising locating a resistive fault in the cable where each section of the shield has an original series resistance, said method comprising:

measuring steady state voltage and current at each end of each section of the shield;

calculating from the measured steady state voltages and currents a calculated fault resistance of each section of the shield;

identifying a faulted section containing a resistive fault from the magnitude of the calculated fault resistance;

calculating the distance along the broken section to the resistive fault from the measured steady state voltages and currents of the faulted section.

8. A method according to claim 7 comprising:

providing a base station at said one end of the cable;

providing a plurality of remote sensor stations at junctions of respective pairs of the cable sections;

actuating each remote sensor station to perform the steps of measuring voltage and current in response to the application of the step function voltage to the shield.

9. A method according to claim 8 comprising transmitting data representing the measured voltages and currents from the remote sensor stations to the base station and performing at the base station the steps of calculating the calculated capacitance and calculated fault resistance of each section of the shield and the distances to the break and the resistive fault.

10. A method according to claim 9 comprising transmitting the data as electrical pulses on the cable shield.

11. A method according to claim 9 comprising transmitting the data from the respective remote sensor stations at different times.

12. A method according to claim 11 comprising transmitting the data from the remote sensor stations in sequence along the cable, starting with the remote sensor station farthest from the base station.

13. An apparatus for locating a cable break in a cable having a conductive shield extending therealong, wherein the conductive shield is divided into a plurality of sections sequentially along the cable, with each section having an original capacitance, said method comprising:

a power supply for applying a step function voltage to one end of the conductive shield;

sensors for measuring voltage and current as a function of time at each end of each section of the shield; and a computer including:

means for calculating from the measured voltages and currents a calculated capacitance of each section of the shield;

means for identifying a broken section containing the break by comparing the calculated and original capacitances; and means for calculating the distance along the broken section to the break from the calculated and original capacitances of the broken section.

14. An apparatus according to claim 13 including a remote sensing station between each two adjacent sections for generating a signal representing voltage and current data measured at the ends of the adjacent sections.

15. An apparatus according to claim 14 wherein the remote sensing station includes coding means for encoding the voltage and current data as electrical pulses and signal transmitting means for transmitting the encoded data to the computer on the cable shield.

16. An apparatus according to claim 15 wherein the pulses are current pulses.

17. An apparatus according to claim 15 including means for actuating the remote sensing stations sequentially to transmit the encoded data.

18. An apparatus according to claim 13 further comprising means for locating a resistive fault in the cable where each section of the shield has an original series resistance, wherein:

the sensors include means for measuring steady state voltage and current at each end of each section of the shield;

the computer includes:

means for calculating from the measured steady state voltages and currents a calculated fault resistance of each section of the shield;

means for identifying a faulted section containing a resistive fault from the magnitude of the calculated fault resistance; and means for calculating the distance along the faulted section to the resistive fault from the measured steady state voltages and currents of the faulted section.

19. An apparatus according to claim 18 including a remote sensing station between each two adjacent sections for generating a signal representing voltage and current data measured at the ends of the adjacent sections.

20. An apparatus according to claim 19 wherein the remote sensing station includes coding means for encoding the voltage and current data as electrical pulses and signal transmitting means for transmitting the encoded data to the computer on the cable shield.

21. An apparatus according to claim 20 wherein the pulses are current pulses.

22. An apparatus according to claim 20 including means for actuating the remote sensing stations sequentially to transmit the encoded data.

* * * * *